United States Patent
Reykowski

(10) Patent No.: US 7,151,373 B2
(45) Date of Patent: Dec. 19, 2006

(54) ANTENNA ARRANGEMENT FOR ACQUISITION OF A MAGNETIC RESONANCE SIGNAL

(75) Inventor: Arne Reykowski, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/234,705

(22) Filed: Sep. 23, 2005

(65) Prior Publication Data
US 2006/0061362 A1     Mar. 23, 2006

(30) Foreign Application Priority Data
Sep. 23, 2004     (DE) ...................... 10 2004 046 188

(51) Int. Cl.
*G01V 3/00* (2006.01)
(52) U.S. Cl. ...................... 324/318; 324/322
(58) Field of Classification Search ................ 324/318, 324/319, 322, 309, 307, 300; 600/610, 621, 600/622
See application file for complete search history.

(56) References Cited

U.S. PATENT DOCUMENTS

| | | | | |
|---|---|---|---|---|
| 5,256,971 A | * | 10/1993 | Boskamp | ..................... 324/318 |
| 5,302,901 A | * | 4/1994 | Snelten | ......................... 324/322 |
| 5,376,885 A | * | 12/1994 | Arakawa et al. | ............. 324/322 |
| 5,708,361 A | | 1/1998 | Wang et al. | |
| 5,973,495 A | * | 10/1999 | Mansfield | ..................... 324/322 |
| 6,348,794 B1 | | 2/2002 | Nabetani et al. | |
| 6,900,636 B1 | * | 5/2005 | Leussler | ...................... 324/318 |
| 2005/0270031 A1 | * | 12/2005 | Oppelt et al. | ................ 324/322 |

\* cited by examiner

*Primary Examiner*—Brij B. Shrivastav
(74) *Attorney, Agent, or Firm*—Schiff Hardin LLP

(57) ABSTRACT

An antenna arrangement for acquisition of a magnetic resonance signal has at least two acquisition antennas, each having at least one conductor loop and each conductor loop having an interruption therein. The conductor loops are connected in parallel at the interruptions and a capacitive decoupling element is arranged in at least one of the interruptions. The acquisition antennas are connected with one another via at least two capacitive blocking elements, and all capacitive blocking elements and all capacitive decoupling elements together exhibit a capacitance at which the acquisition antennas are decoupled from one another. The acquisition antennas are connected with one another via an inductive element that is connected in parallel with the capacitive blocking elements. The inductive element exhibits an inductance at which a common mode signal between the acquisition antennas is suppressed.

4 Claims, 1 Drawing Sheet

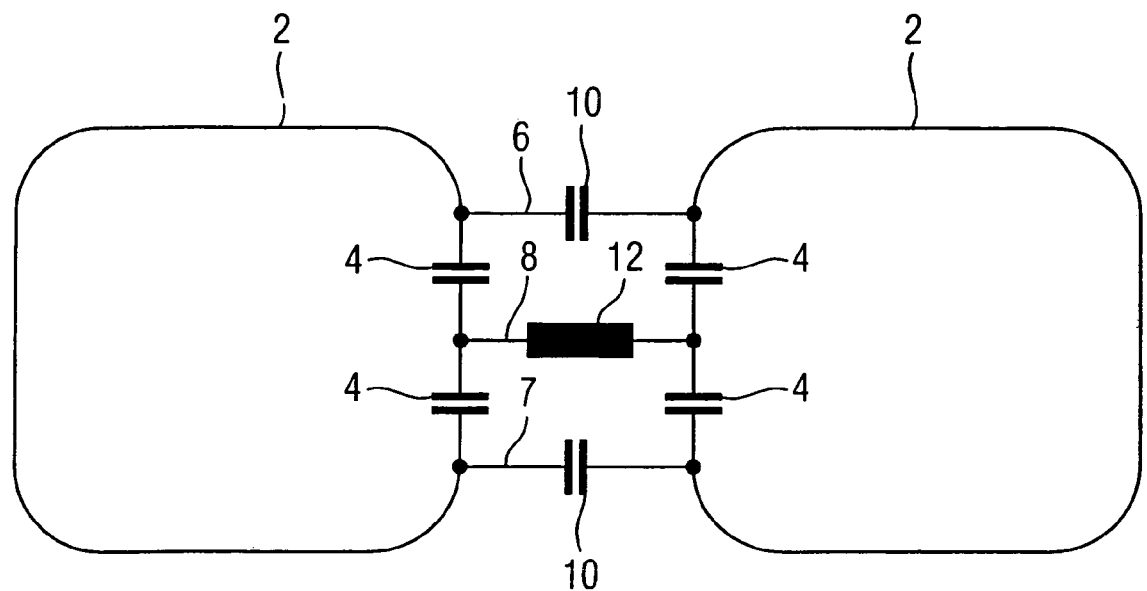

ANTENNA ARRANGEMENT FOR ACQUISITION OF A MAGNETIC RESONANCE SIGNAL

BACKGROUND OF THE INVENTION

1. Field of the Invention

The present invention concerns an antenna arrangement for acquisition of a magnetic resonance signal with at least two acquisition antennas, of the type wherein each of the acquisition antennas has at least one conductor loop and the conductor loops each exhibit an interruption (gap), and wherein the conductor loops are connected in parallel at the interruptions and a capacitive decoupling element is connected at least at one of the interruptions, the capacitive coupling element exhibiting a capacitance at which both acquisition antennas are decoupled from one another.

2. Description of the Prior Art

In antenna arrangements with a number of individual antennas, a radio-frequency current in one antenna can induce a voltage in an adjacent individual antenna, known as coupling. The coupling can be present both in circularly polarized antenna arrangements, wherein two antenna systems are aligned perpendicular to one another, and in antenna arrays wherein the individual antennas generally possess the same alignment. Couplings generally worsen the signal-to-noise ratio (S/N ratio) of the overall signal. In addition, the effort for compensation and testing of coupled individual antennas is greater than for compensation and testing of uncoupled individual antennas. It is therefore desirable to prevent coupling of individual antennas.

An antenna arrangement for a magnetic resonance apparatus of the initially-described general type is known from DE 195 36 531 C2. Two adjacent individual antennas each exhibit an interruption (gap). Each interruption is bridged with a capacitive element, so the individual antennas are decoupled. Possible couplings of the individual antennas via a common mode current created on the connection lines are suppressed by a sheath wave barrier.

Damping of the differential signal necessary for decoupling of the individual antennas and by the capacitive element, however, results due to the sheath wave barrier.

An RF coil for magnetic resonance imaging is described in U.S. Pat. No. 6,348,794, in which three acquisition antennas are electronically connected in parallel via two lines. Each of the acquisition antennas is formed by a conductor loop that exhibits an interruption. A capacitive element is arranged in each interruption. A further capacitive element is arranged in the parallel connections between the conductor loops. In one embodiment, an inductor, which can be connected or disconnected via a diode arrangement, is connected in parallel with the capacitive element in one of the connections between the conductor loops.

SUMMARY OF THE INVENTION

An object of the present invention is to achieve a possibility for decoupling of adjacent individual antennas while preventing, as much as possible, additional damping losses.

The above object is achieved in accordance with the present invention by an antenna arrangement for acquiring a magnetic resonance signal having at least two acquisition antennas, each acquisition antenna being formed by at least one conductor loop, and each conductor loop having an interruption therein. The conductor loops are connected in parallel at the interruptions, and a capacitive decoupling element is connected in at least one of the interruptions. The acquisition antennas are connected with each other via at least two capacitive blocking elements. All of the capacitive blocking elements and all of the capacitive decoupling elements, in combination, exhibit a capacitance at which the acquisition antennas are decoupled from each other. The acquisition antennas also are connected with each other via an inductive element, which is connected in parallel with the capacitive blocking elements. The inductive element has an inductance at which a common mode signal between the acquisition antennas is suppressed.

Both acquisition antennas thus are decoupled by the capacitive decoupling element. The current induced in an individual antenna generates a differential signal in the adjacent individual antenna via the common capacitor for both individual antennas, the differential signal compensating the voltage induced by the magnetic coupling. Possible common mode signals generated by the parallel connection of the conductor loops are suppressed by the inductive element and the capacitive blocking elements connected in parallel.

In an embodiment of the invention, two capacitive decoupling elements are arranged in each interruption, with all capacitive decoupling elements together exhibiting a capacitance at which the acquisition antennas are decoupled from one another. This symmetrical arrangement makes dimensioning of the component easier.

In an embodiment of the invention, the conductor loops are connected in parallel via at least three connections, with two of the connections connecting the conductor loops outside of the interruptions and a third of the connections joining the interruptions between the capacitive decoupling elements. One of the capacitive blocking elements is arranged in the two first-cited connections and the inductive element is arranged in the third connection. This arrangement of the components is particularly simple to execute.

DESCRIPTION OF THE DRAWING

The single FIGURE is a circuit diagram of an antenna arrangement constructed and operating in accordance with the present invention, in an embodiment having two acquisition antennas.

DESCRIPTION OF THE PREFERRED EMBODIMENTS

An antenna array that has two adjacent acquisition antennas is shown as an antenna arrangement in the FIGURE. Each acquisition antenna has a conductor loop 2. Each conductor loop 2 has an interruption at the side facing the other conductor loop 2. Each interruption is bridged by two capacitive decoupling elements 4. The conductor loops 2 are connected in parallel by three connections 6, 7 and 8 at the interruptions. The connections 6 and 7 connect the conductor loops 2 outside of the interruptions; the connection 8 joins the interruptions between the capacitive decoupling elements 4. A capacitive blocking element 10 is connected arranged in each of the connections 6 and 7. An inductive element 12 is arranged in the connection 8. This is executed as a choke coil in the present example.

Without the capacitive decoupling elements 4 and the capacitive blocking elements 10, due to a current in one of the two conductor loops 2 a voltage would be induced in the other conductor loop 2. A voltage drop generated by the flowing current at the capacitive decoupling elements 4 generates complementary signals via the capacitive blocking elements 10, which compensate the induced voltage given suitable selection of the corresponding components.

However, an unwanted common mode current can occur in the arrangement due to the physical length of the arrangement as well as parasitic capacitances. Currents then flow across the arrangement and in particular through the connections 6 and 7 in which capacitive blocking elements 10 are arranged. The common mode current arises as soon as the currents between the conductor loops add up to a non-disappearing total current. The common mode current is suppressed by the insertion of the inductive element 12. The choke coil used in the present example, together with both of the capacitive blocking elements 10 connected in parallel to it, thereby forms high-ohmic impedance for the common mode current. Compared to previous solutions in which primarily sheath wave barriers were used for suppression of the common mode current, in the inventive arrangement the advantage results that the differential signal necessary for decoupling of the conductor loops is not influenced by the choke coil. Given use of sheath wave barriers, both the common mode signal and the differential signal are similarly damped by the sheath wave barrier. A damping of the differential signal leads to an unwanted degradation of the S/N ratio. Due to the symmetrical arrangement of the capacitive decoupling elements 4 and of the capacitive blocking elements 10 in the shown arrangement, the differential signal only flows only over the two connections with the capacitors while the common mode signal is suppressed. Dependent on the capacitors used, an optimal suppression of the common mode signal results given an inductance L of the choke coil of:

$$L = \frac{1}{\omega^2}\left(\frac{1}{2C_k} + \frac{1}{C_A}\right)$$

wherein $\omega$ is the angular frequency of the transmitted signal, $C_k$ is the capacitance of the capacitive blocking elements 10 and $C_A$ is the capacitance of the capacitive decoupling elements 4.

Although modifications and changes may be suggested by those skilled in the art, it is the intention of the inventor to embody within the patent warranted hereon all changes and modifications as reasonably and properly come within the scope of his contribution to the art.

I claim as my invention:

1. An antenna arrangement for acquiring a magnetic resonance signal comprising:
   at least two acquisition antennas, each of said acquisition antennas comprising at least one conductor loop having an interruption therein;
   said conductor loops being connected in parallel at the respective interruptions, with a capacitive decoupling element connected in at least one of the interruptions;
   at least two capacitive blocking elements connecting said acquisition antennas with each other;
   all of said capacitive blocking elements and all of said capacitive decoupling elements in combination exhibiting a capacitance at which said acquisition antennas are decoupled from each other; and
   an inductive element connected in parallel with said capacitive blocking elements, said inductive element having an inductance at which a common mode signal between the acquisition antennas is suppressed.

2. An antenna arrangement as claimed in claim 1 comprising, in each interruption, two capacitive decoupling elements, wherein all of said capacitive decoupling elements in combination exhibiting a capacitance at which said acquisition antennas are decoupled from each other.

3. An antenna arrangement as claimed in claim 2 comprising at least three connections connecting said conductor loops in parallel, two of said three connections connecting the conductor loops outside of the respective interruptions, and a third of said three connections joining said interruptions between said capacitive decoupling elements, and wherein one of said capacitive blocking elements is connected in said two of said three connections, and said inductive element is connected in said third of said three connections.

4. An antenna arrangement as claimed in claim 1 wherein said inductance element has an inductance $$L = \frac{1}{\omega^2}\left(\frac{1}{2C_k} + \frac{1}{C_A}\right)$$

wherein $\omega$ is the angular frequency of the transmitted signal, $C_k$ is the capacitance of the capacitive blocking elements and $C_A$ is the capacitance of the capacitive decoupling elements.

* * * * *